United States Patent
Khouw et al.

(10) Patent No.: US 6,469,496 B1
(45) Date of Patent: Oct. 22, 2002

(54) ELECTRONIC MEMORY MODULE HANDLER WITH DIRECT SOCKET INSERTION AND RELATED OUTPUT STACKER

(75) Inventors: Richard S. Khouw, Dallas, TX (US); Hua Kin Lim, Irving, TX (US); Chi Wo Ip, Fort Worth, TX (US)

(73) Assignee: Computer Service Technology, Inc., Dallas, TX (US)

( * ) Notice: Subject to any disclaimer, the term of this patent is extended or adjusted under 35 U.S.C. 154(b) by 9 days.

(21) Appl. No.: 09/640,583

(22) Filed: Aug. 18, 2000

(51) Int. Cl.[7] .......................... G01R 35/00; B07C 5/344
(52) U.S. Cl. ..................... 324/158.1; 209/573
(58) Field of Search ............................. 324/158.1, 765, 324/760, 763; 209/2, 573; 414/331.01, 416.07, 403

(56) References Cited

U.S. PATENT DOCUMENTS

| | | |
|---|---|---|
| 5,538,436 A | 7/1996 | Garney |
| 5,635,832 A | 6/1997 | Ito |
| 5,704,489 A | 1/1998 | Smith |
| 5,754,057 A | 5/1998 | Hama |
| 5,829,942 A | 11/1998 | Beers |
| 5,954,205 A | 9/1999 | Smith |
| 5,973,285 A | 10/1999 | Dietrich |
| 6,046,421 A | 4/2000 | Ho |
| 6,218,852 B1 * | 4/2001 | Smith et al. ............. 324/158.1 |

* cited by examiner

*Primary Examiner*—N. Le
*Assistant Examiner*—James Kerveros
(74) *Attorney, Agent, or Firm*—Howison, Thoma & Arnott, L.L.P.

(57) ABSTRACT

An apparatus which inserts electronic memory modules into test equipment via direct horizontal insertion eliminating the need for intermediary connectors or adapters. The apparatus incorporates guide rails that maintain precise alignment of the electronic memory modules through the testing apparatus, sensors and microprocessor controlled belt apparatus to clear the automated transport paths of electronic memory module handler apparatus and automatically stacks the tested electronic memory modules.

18 Claims, 14 Drawing Sheets

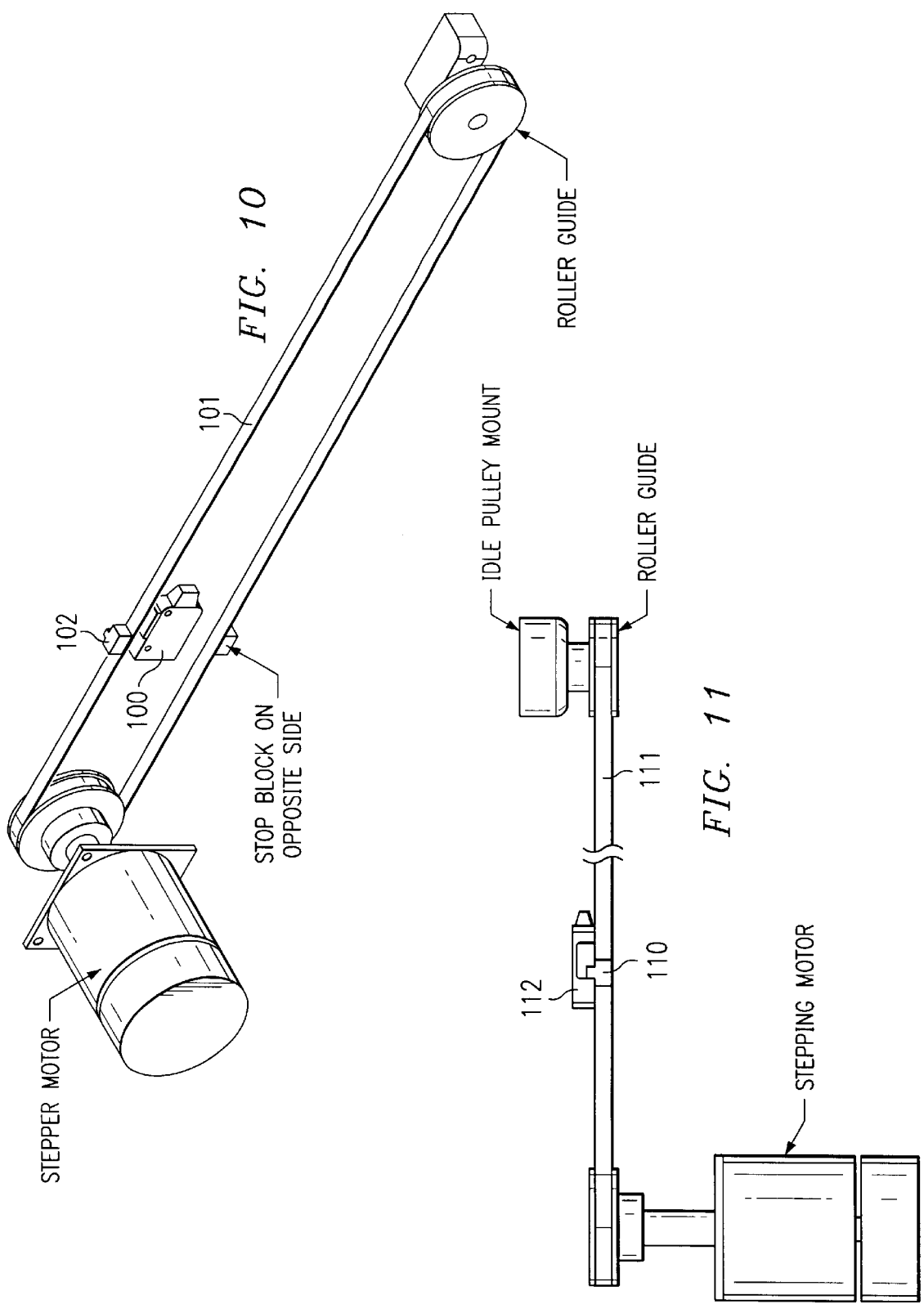

ELECTRONIC MEMORY MODULE HANDLER WITH DIRECT SOCKET INSERTION AND RELATED OUTPUT STACKER

TECHNICAL FIELD OF THE INVENTION

The present invention relates in general to electronic test equipment, and in particular to an electronic memory module tester having an automatic feeder handler and alignment assembly.

BACKGROUND OF THE INVENTION

Prior art test equipment includes automatic testers for testing electronic memory modules. The electronic memory modules have typically comprised circuit boards that have random access memory (RAM) integrated circuits mounted thereto. The circuit boards have been provided with surface contact pads that are typically aligned along one edge of the circuit board. This type edge connector configuration has been utilized for connecting the RAM integrated circuit components mounted to the circuit board to data buses of the devices within which the memory modules are used. Such memory modules have included SIMM, DIMM, and SODMM types of memory. Additionally, memory cards may also be utilized having the appearance of a credit card, and also having surface connectors mounted thereto for connecting the internally disposed memory thereof to equipment in which the aforementioned memory module is used.

Prior art in the technical field of the invention has encountered several important problems that negatively affect the accuracy and reliability of the test equipment. The invention described herein addresses these problems.

Test Accuracy. Electronic memory modules are typically tested after manufacturing to assure that they will perform properly after installation into a data processing system. Usually, a test connector is removably secured to edge connectors of the electronic memory modules under test to make contact to the surface pads for connecting the electronic memory modules to testing circuitry. In the prior art, automatic memory module test equipment included automatic memory module handlers. These prior art handlers typically utilized a conveyer belt for automatically feeding components through the test equipment. A stop was often utilized which was selectively retractable. The stop was selectively extended to stop the electronic memory module under test in a second position for engaging a connector to electrically connect the electronic memory module under test to the test equipment circuitry.

As is well known in the art, memory modules and the edge connectors therefor have been greatly reduced in size in recent years. The size of the connecter contact members has often been expressed in terms of the distance between corresponding points on adjacent ones of the surface contact pads of the electronic memory modules. Prior art contact pad spacing have been sized from 0.050 to 0.070 inches apart (50 mil to 70 mil). More recently, component spacing of 0.030 inches (30 mil) down to 0.025 inches (25 mil) have been utilized in fabricating electronic memory modules.

These recent reductions in the size of spacing between contact pads have reduced the ability of prior art handlers to adequately position the electronic memory modules edge surface contact pads for aligning with the test leads of the test connectors mounted to the handler equipment. This often results in test failures caused by misalignment between the test leads and the surface contact pads. Improvements for more closely aligning electronic memory modules under test with tester equipment connectors are desirable, such that alignment therebetween will be improved and the failure rate of electronic memory modules caused by inadequate testing procedures and equipment will be reduced.

Additionally, the testing of memory modules has become extremely sensitive to electrical current and testing signal irregularities. Prior art required adapters that are the actual testing contact with the memory testers. These prior art adapters produce current and testing signal irregularities that produce false or inaccurate testing results. Physically, the "fingers" are 1.5 inch long. A transition board also has to be made to adapt the signal source connection to the "finger" connection. This complicates the electrical path by the addition of one connector transition and also the 1.5 inch length of the contactor. This addition works fine at a low frequency signal situation (under 50 Mhz) while it totally distorts the signal at high frequency. The term is call "impedance mis-mismatch". It essentially means that a normal signal goes through a not-so-smooth path and part of the signal is bounced back (echo) instead of getting through. The bounced back signal causes the original signal to have a "double vision" at the end of the path and render the signal un-recognizable.

The recent increases in sensitivity of memory modules to current and signal irregularities make it highly desirable to develop testing mechanisms and methodologies that minimize irregularities in current and signal.

Additionally, prior art handler equipment uses a retractable platform on which the module rests during the testing process. When testing is completed, the platform is retracted, allowing the module to drop into a mechanism that moves the module away from the testing position. The retractable platform in prior art requires constant adjustment because memory modules do not have a uniform thickness. Some modules have memory chips attached to only one side of the module board. Some modules have memory chips attached to both sides of the module board. Memory chips are also uneven in thickness. This uneven thickness of memory modules requires adjustment of the retractable platform. Misalignment of the platform can cause jams because the modules are then not in position for the testing process. Misalignment of the platform also causes test failures due to simple misalignment of the module in the memory tester. Additionally, repeated insertions of electronic memory modules into the testing interfaces of electronic memory module testers causes wear in the plastic edges of the interfaces. The wear of these edges results in improper alignment of electronic memory modules.

The recent developments in memory module design, as described previously, make it extremely important to develop a mechanism for the insertion of memory modules in the memory testers that prevent jams and misalignment.

The invention as described herein corrects the aforementioned technical problems in the field of electronic memory module testing. The invention aligns and positions electronic memory modules more precisely than prior art. The use of guides and rails in the invention prevent misalignment. The implementation of protective interface guides prevents misalignment resulting from repeated inserts of electronic memory modules.

Automation. Industries that utilize memory modules usually utilize memory modules in high quantities. Therefore, the testing of memory modules is a process that must test high quantities of memory modules. The automation of the memory module testing is essential to the profitable and efficient operation of businesses that use memory modules. The industry uses handler equipment to bring untested memory modules to the memory tester, insert the memory modules into the tester, and sort the tested memory modules.

Prior art handlers use stacking columns that hold vertically stacked memory modules. Prior art stacking columns were susceptible to uneven stacking by operators. Unevenly stacked modules would enter the testing process unevenly and in positions that would cause jams in the testing pathway. The possibility of these jams renders prior art unsuitable to be used in the absence of an operator. The invention described herein produces uniform and even stacks of electronic memory modules.

Prior art handlers sort memory modules by depositing the modules into bins or receptacles. This method of sorting causes the memory modules to fall into bins. The falling modules can be damaged. As a result of this damage, even modules that pass testing can be subsequently damaged in the sorting process. The invention described herein automatically stacks tested electronic memory modules and eliminates the problem described above.

Prior art handler equipment uses conveyor belts to move modules along the testing path. The modules can become misaligned on the conveyor belt and jam the handler. When this happens, prior art requires an operator to manually clear the conveyor path, reset the equipment and restart the testing process. The possibility of these jams renders prior art unsuitable to be used in the absence of an operator. The invention described herein automatically detects jams and clears object from conveyor belt transport systems without the need of human attention.

Prior art handler equipment uses conveyor belts with stops that protrude up from the surface of the conveyor belt. These stops are used to position the memory modules into testing position and to move the memory module along the testing path. In prior art, these stops frequently caused jams in the testing pathway poor positioning. If a memory module is placed on a stop, the module will become jammed along the testing pathway. This malfunction occurs because the handler does not have a means of positioning the stops in places that will avoid jamming the test pathway. The invention described herein detects the positions of stops to prevent positions that would cause jams.

SUMMARY OF THE INVENTION

The present invention disclosed and claimed herein horizontally inserts memory modules directly into the testing sockets of memory testers. This horizontal and direct insertion virtually eliminates problems of current irregularity, signal fluctuations, and memory module misalignment encountered by prior art.

The present invention disclosed and claimed herein utilizes retractable rails on which memory modules rest as they are inserted into the memory module tester. The retractable rails hold the memory module by the edges of the memory module. Holding the memory modules in such a way eliminates the problems encountered by prior art caused by the irregular thickness of memory chips. The retractable rails position all memory modules in proper alignment regardless of the thickness of the memory chips used on the memory module.

The present invention disclosed and claimed herein uses a carriage that holds a memory module in the proper alignment by using guide rods that fit into standard notches in memory module boards. The guide rods hold the memory module during insertion into the memory module tester and provides the hold necessary to remove the memory module from the tester apparatus.

The present invention disclosed and claimed herein comprises an apparatus that stacks memory modules evenly and in proper alignment for the testing process. This apparatus consists of a stacking tray similar in construction and design to prior art stacking trays. However, the present invention incorporates guide rods positioned in the stacking column that match standard notches found on all memory module boards. The rods, when properly fitted into these notches, produce an evenly stacked column of untested modules. The guide rods hold the memory modules in the proper alignment for insertion into the testing socket of memory module testers.

The present invention disclosed and claimed herein comprises a conveyor belt that has protruding stops, an infrared sensor, a microprocessor and a step motor. The protruding stops have a shape that obscures the infrared sensor when moved over the sensor. The sensor, when blocked by the stop, causes the microprocessor to calibrate the position of the stop. The microprocessor then causes the step motor to move the stop to the proper position so that the stop will not cause jams in the testing pathway.

The present invention disclosed and claimed herein uses the stop blocks to clear the conveyor belt pathway by moving the stop blocks along the conveyor belt pathway in both directions.

The present invention disclosed and claimed herein comprises an output stacker that receives tested modules and automatically stacks the modules for delivery. The tested module is moved to the stacker and slides onto a platform. The module is moved into the proper stacking position by a vertical rod. The platform is moved up to the bottom of a module stacker column. The bottom of the module stacker column has a mechanism that secures the memory module to the bottom of the stack

BRIEF DESCRIPTION OF THE DRAWINGS

FIG. 10 illustrates the sensor mechanism.

FIG. 11 illustrates the belt transport mechanism—top view.

DETAILED DESCRIPTION OF THE INVENTION

Figure 1:
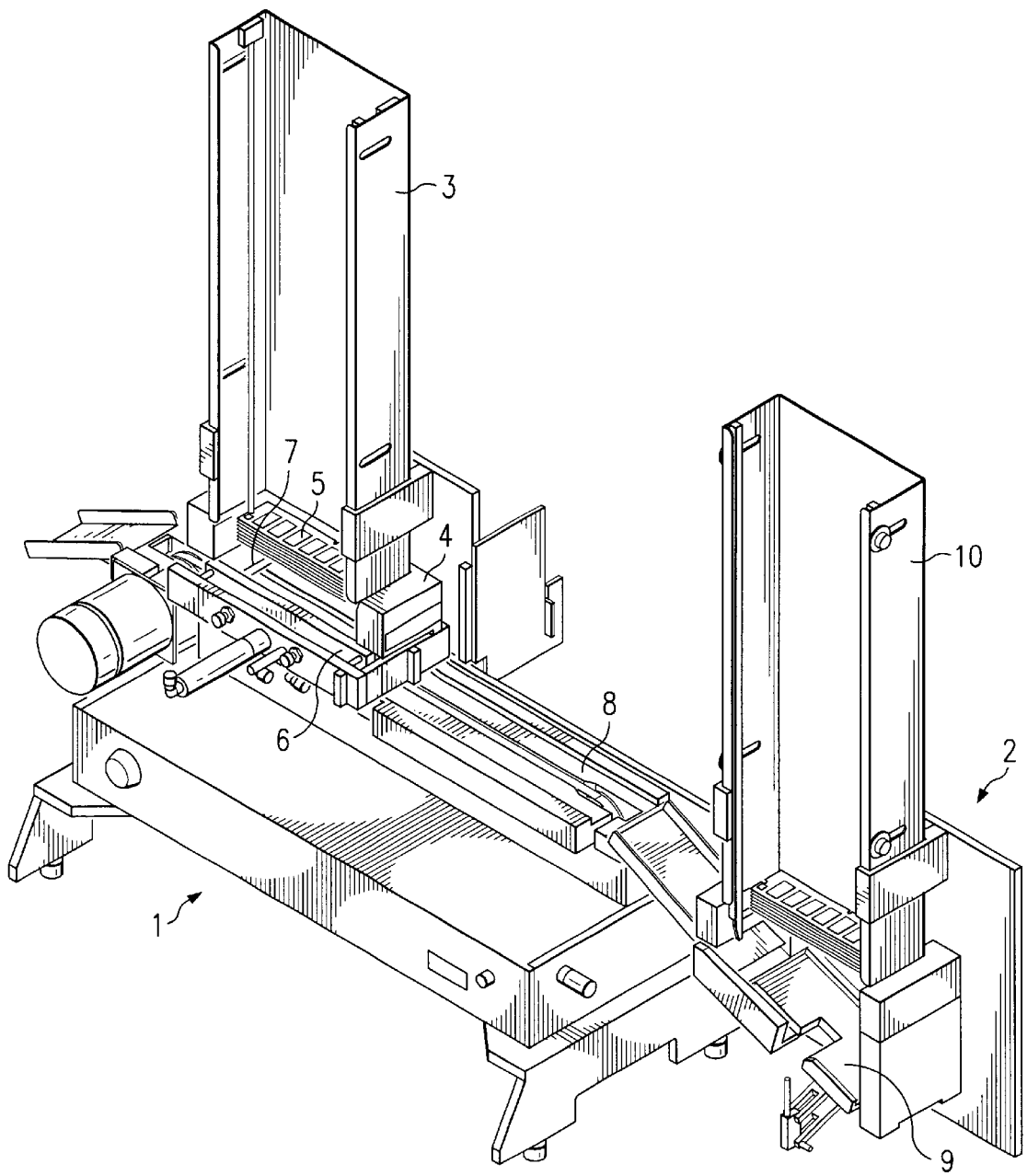
FIG. 1 illustrates the memory module handler and stacker assembly.

Referring to FIG. 1, there is illustrated a memory module handler 1 and a stacker assembly 2 attached. FIG. 1 illustrates the manner in which the various components of this invention are interrelated. The input tray 3 is attached to a singulator 4 that regulates the rate at which memory modules are inserted into the invention. Memory modules 5 are placed into the input tray. The memory modules 5 are input into the invention by a singulator 4. A singulator drops memory modules into the memory module pusher assembly 6. Retractable holders 7 prevent the memory module 5 from falling through the pusher assembly 6. The memory module pusher assembly 6 inserts memory modules 5 into an attached memory module tester. After a memory module 5 has been tested, the pusher assembly 6 removes the memory module from the attached memory module tester. After a memory module 5 has been removed, it is released from the pusher assembly 4 by putting the retractable holders 7 into a position that drops the memory module 5 from the memory module pusher assembly 4 onto the belt mechanism 8. The belt mechanism 8 moves the tested memory module 5 to the stacker assembly 2. The stacker assembly 2 receives the memory module 5 and the stacker platform 9 raises the memory module 5 to the bottom of the output tray 10. The output tray 10 contains a stack of tested memory modules 5.

Figure 2:
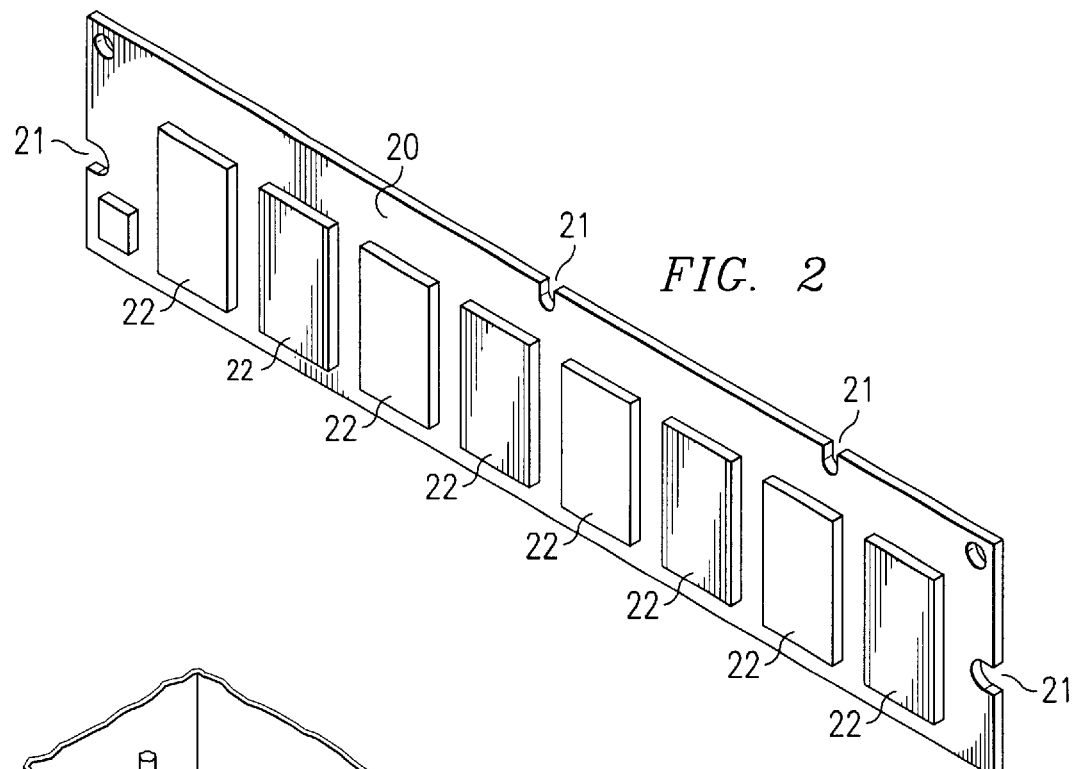
FIG. 2 illustrates a memory module.

Referring to FIG. 2, there is illustrated a typical electronic memory module. A typical electronic memory module consists of a board 20 that has notches 21. On the board 20 are attached various memory chips 22.

Figure 3:
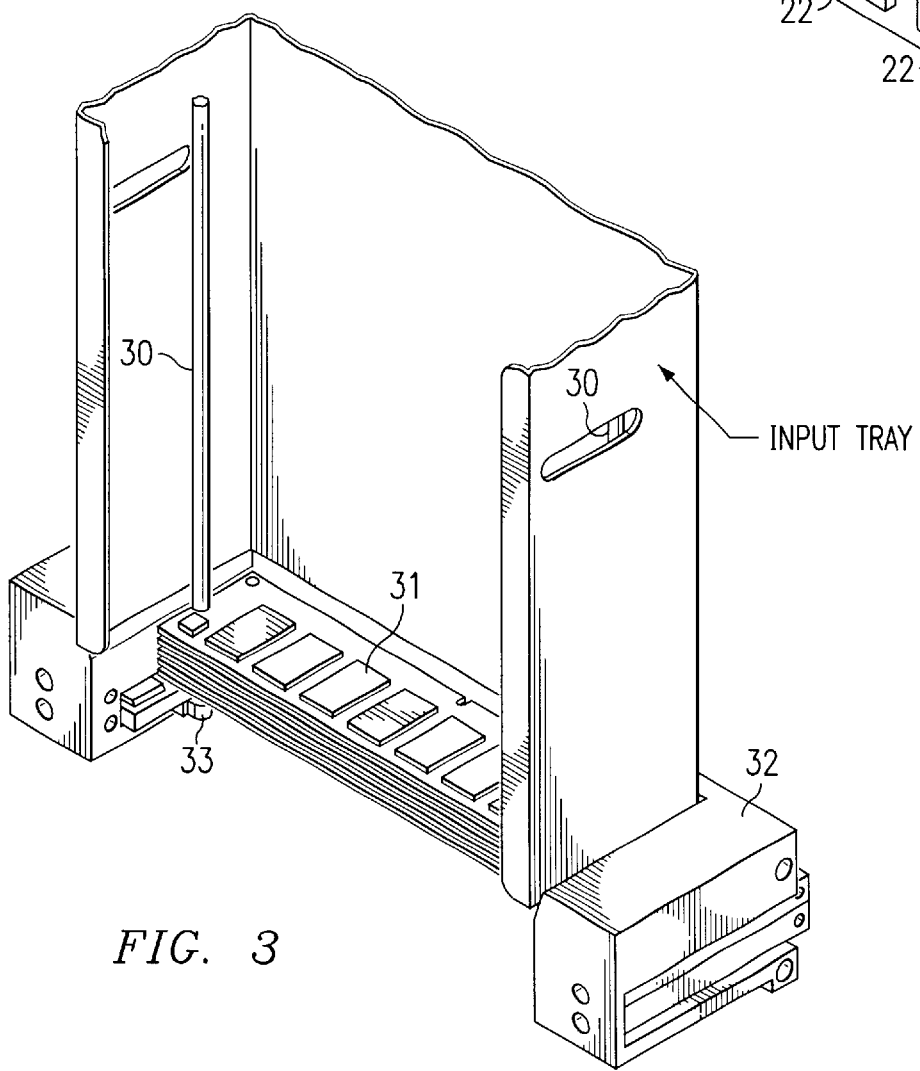
FIG. 3 illustrates a memory module input tray.

Referring to FIG. 3, there is illustrated a memory module input tray. The input tray incorporates two guide rods 30. The guide rods are attached to the input tray in a position to fit into the notches 21 of a typical memory module 31. A singulator 32 allows a single memory module 31 to pass at a time. The singulator 32 incorporates guide rods 33 that fit into the notches 21 of a typical memory module 31. The guide rods of the input tray 30 and the guide rods of the singulator 33 position a memory module 31 for proper insertion into the pusher assembly (FIG. 4).

Figure 4:
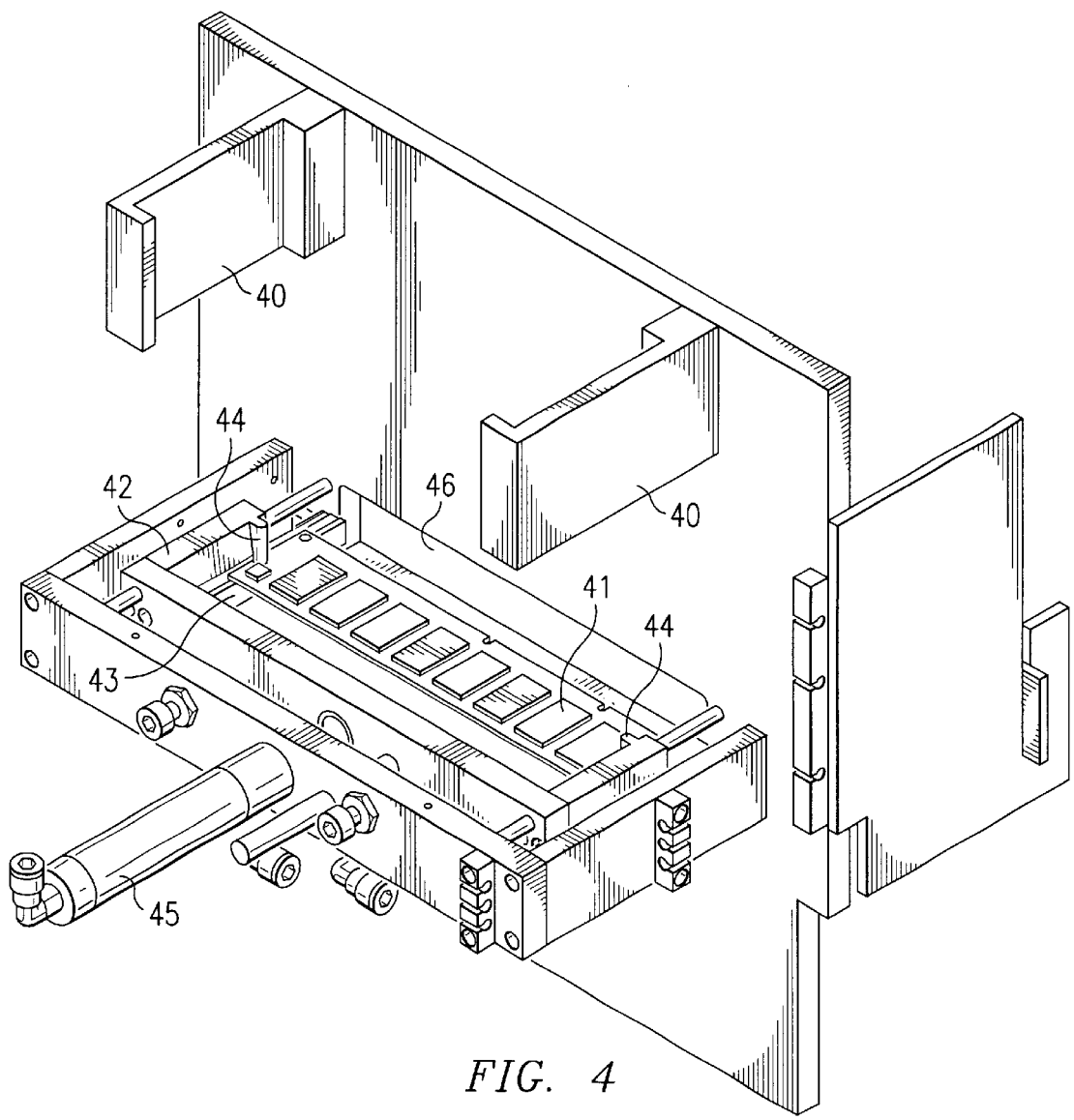
FIG. 4 illustrates a memory module pusher assembly—front view.

Referring to FIG. 4, there is illustrated a pusher assembly, front view. An input tray 3 is held in place by input tray holders 40. FIG. 4 illustrates a memory module 41 placed into the pusher assembly by a singulator 32. Retractable holders 43 hold the memory module in the proper vertical position. A memory module 41 is held in the proper horizontal position by guide rails 44. An air cylinder 45 pushes an pulls the pusher frame 42 toward and from the socket gap 46. A memory module tester is positioned such that its testing socket aligns with the socket gap 46. When fully extended by the air cylinder 45, the memory module 41 is inserted into the testing socket of a memory module tester.

Figure 5:
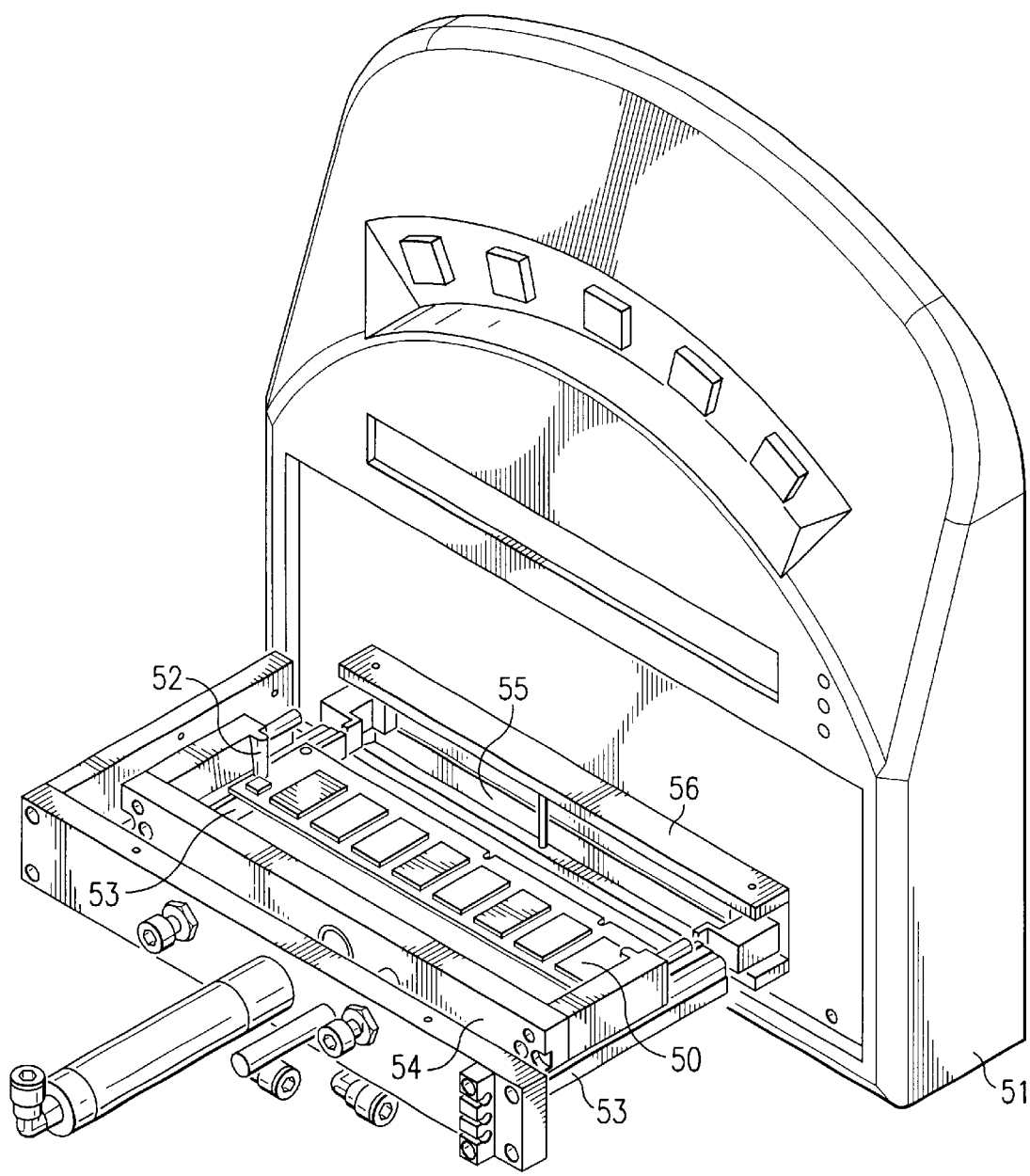
FIG. 5 illustrates memory module pusher assembly with memory module tester—cross section.

Referring to FIG. 5, there is illustrated a cross section of a pusher assembly with a electronic memory module tester attached. An electronic memory module 50 is depicted in position to be inserted into the testing interface of the electronic memory module tester 51. The electronic memory module is fixed in position by guide rails 52 and support rails 53. The guide rails 52 hold the electronic memory module 50 in horizontal position and the support rails 53 hold the electronic memory module 50 in vertical position. The pusher assembly 54 inserts the electronic memory module 50 into the testing interface 55 of the electronic memory module tester 51. The electronic memory module tester interface 55 is depicted with an interface guide 56. The interface guide 56 guides the electronic memory module 50 into the electronic memory module tester interface 55. The guide prevents the electronic memory module 50 from improper abrasion against the soft plastic edges of the electronic memory module tester interface 55.

Figure 6:
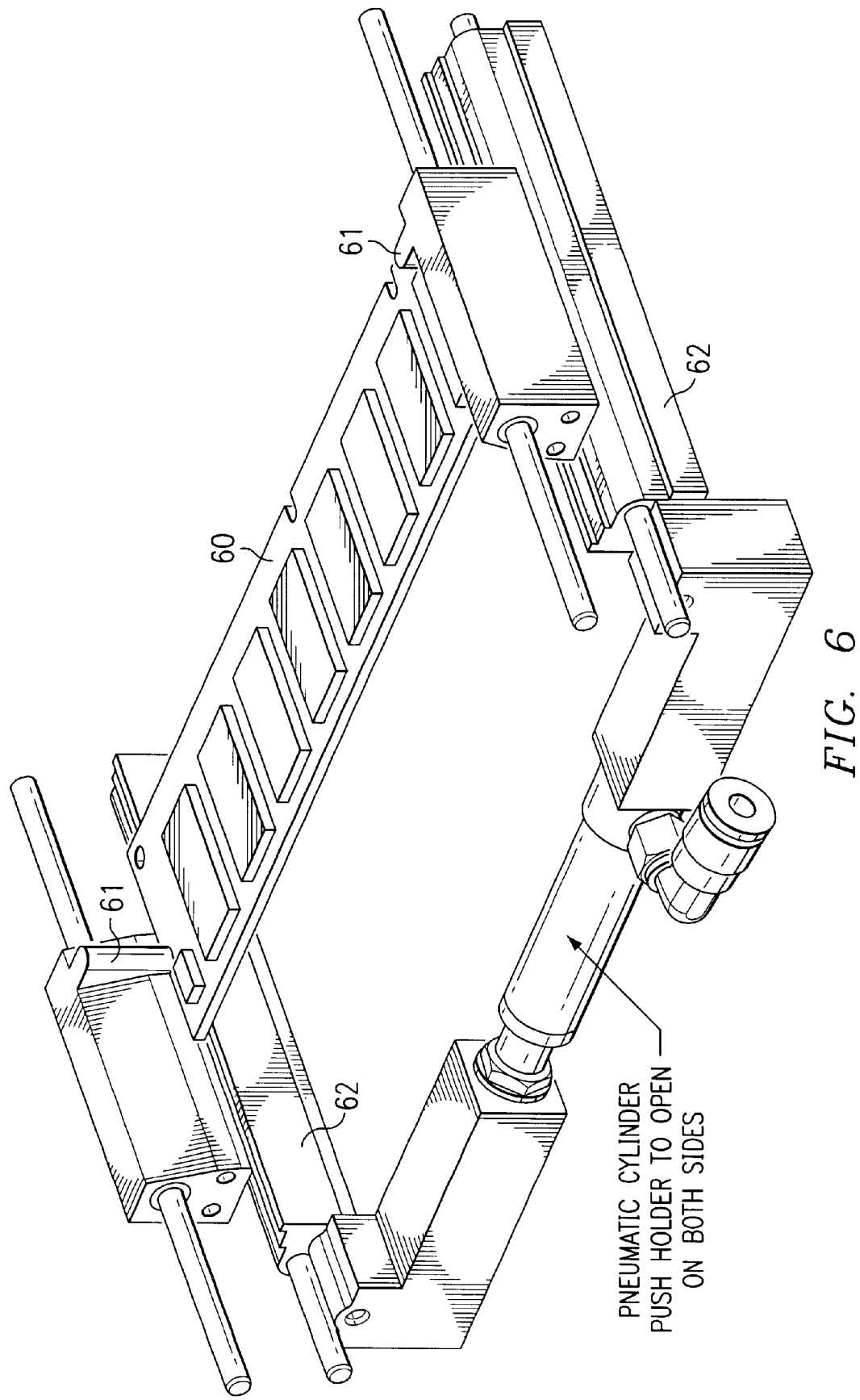
FIG. 6 illustrates a detailed view of guide rails and support rails.

Referring to FIG. 6, there is illustrated a detailed view of the guide rails and support rails. The electronic memory module 60 is depicted held in position by the guide rails 61 and the support rails 62. After the electronic memory module 60 is tested and removed from the electronic memory module tester interface 55, the support rails are moved so that they no longer support the electronic memory module 60 permitting it to fall from the pusher assembly 54.

Figure 7:
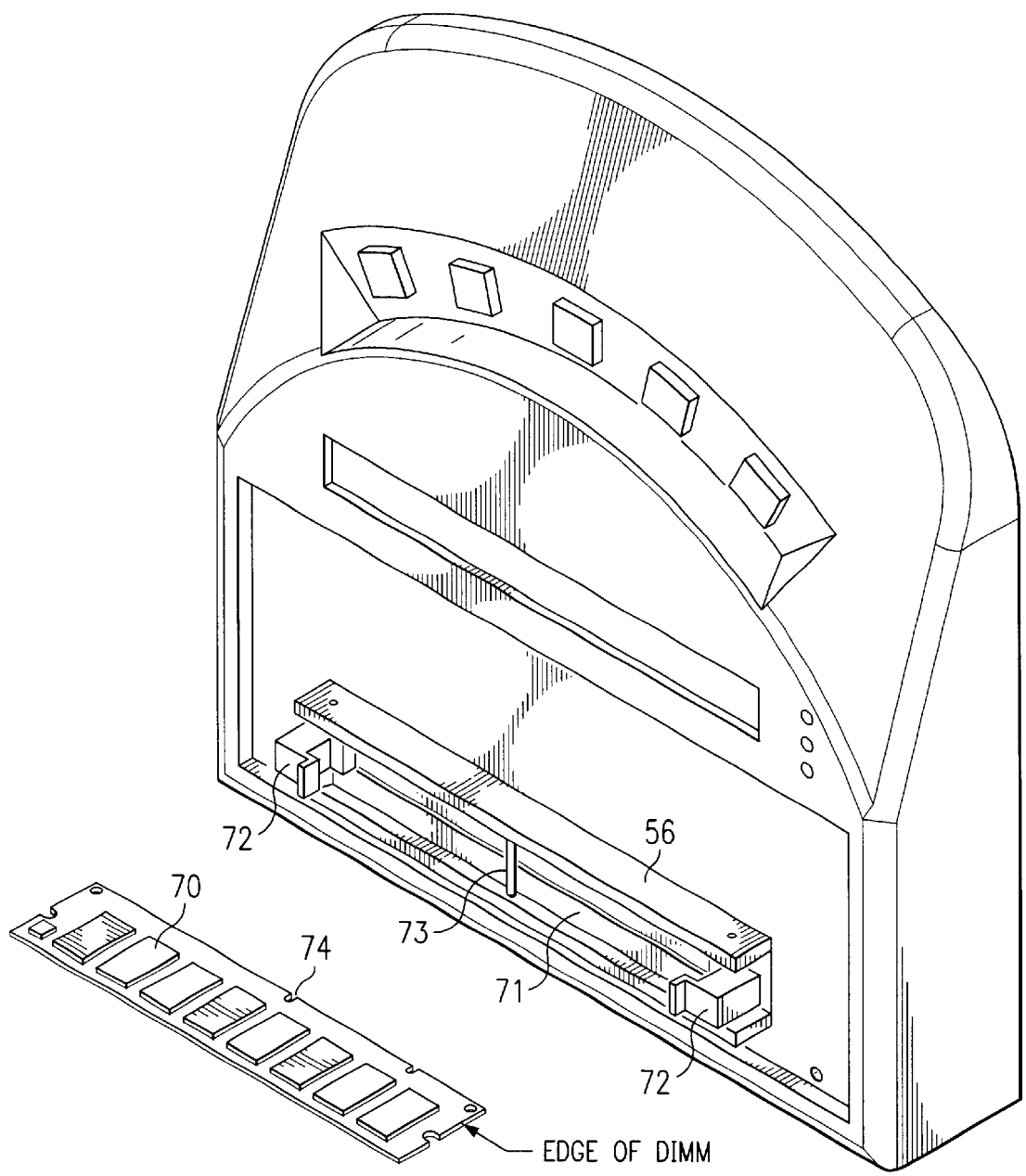
FIG. 7 illustrates an electronic memory module tester with interface guides.

Referring to FIG. 7, there is illustrated an electronic memory module tester with an interface guide. The electronic memory module 70 is positioned in the electronic memory module tester interface 71 by the interface guide 72 and a center guide 73. The center guide 73 fits into a standard notch 74 on a electronic memory module 70. The interface guide 72 prevents improper abrasion against the soft plastic edges of the electronic memory module tester interface 71, and positions the electronic memory module 70 in the proper horizontal position for testing.

Figure 8:
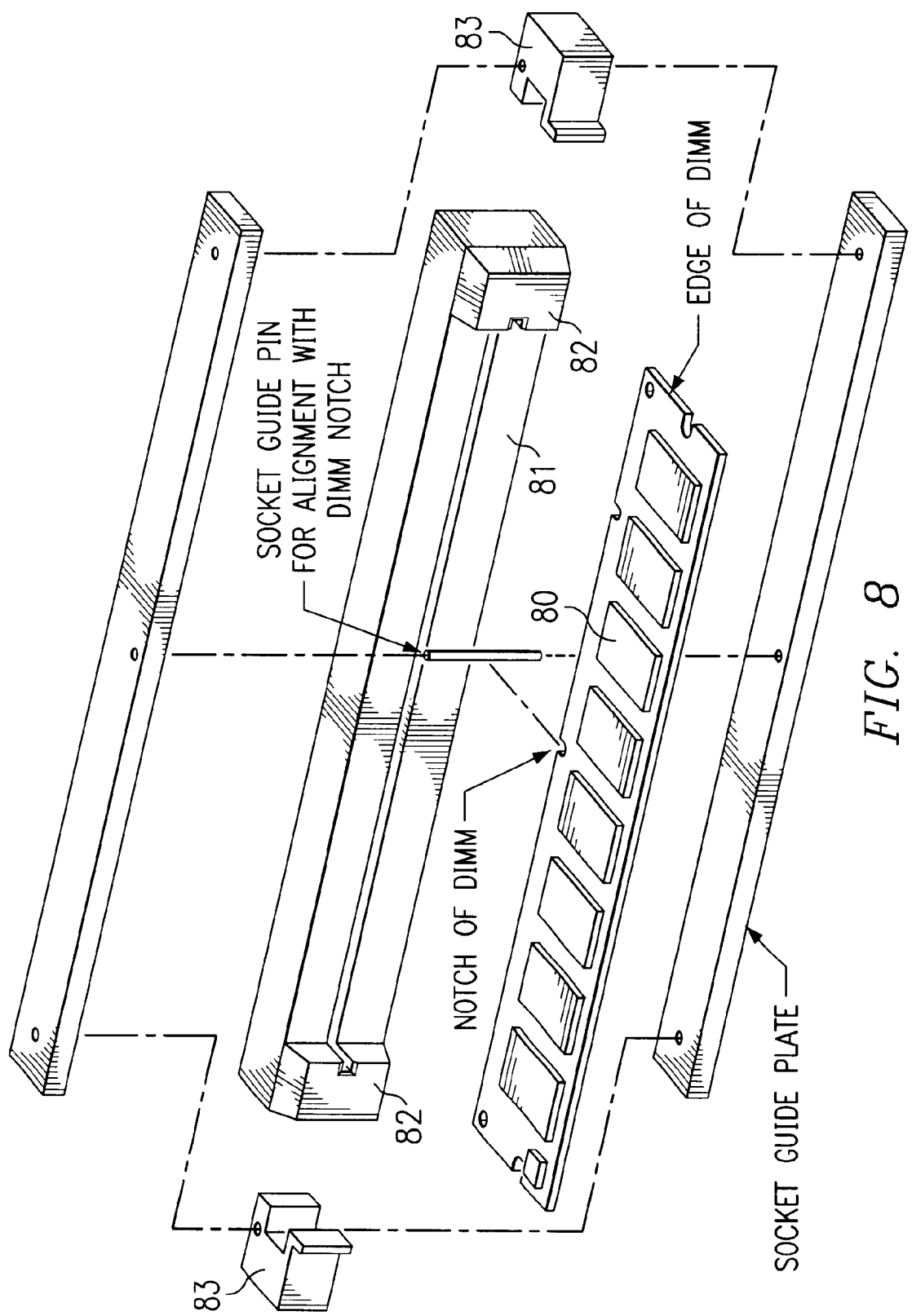
FIG. 8 illustrates interface guides.

Referring to FIG. 8, there is illustrated the interface guide. The electronic memory module 80 is inserted into the electronic memory module tester interface 81. The edges of the electronic memory module tester interface 82 are usually made of plastic. The interface guide 73 is positioned so that the electronic memory module 80 does not directly contact the edges of the electronic memory module tester interface 82. The interface guide 83 prevents improper abrasion against the soft plastic edges of the electronic memory module tester interface 82, and positions the electronic memory module 80 in the proper horizontal position for testing.

Figure 9:
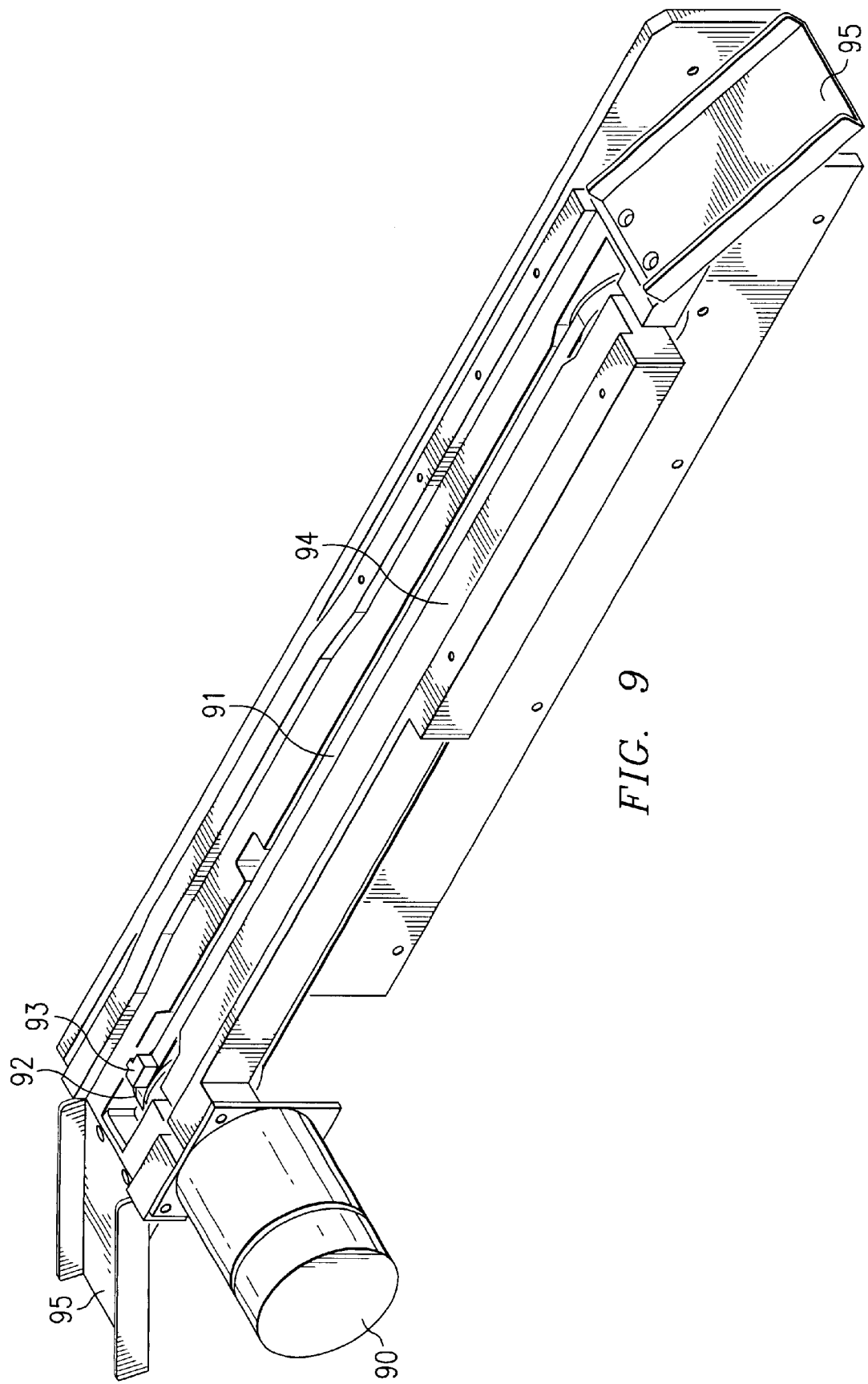
FIG. 9 illustrates the belt transport mechanism.

Referring to FIG. 9, there is illustrated a belt transport mechanism. A stepping motor 90 is attached to a belt 91. The stepping motor 90 moves the belt around a wheel 92. Stop blocks 93 are attached to the belt 91 for alignment purposes. Memory modules 5 are deposited after testing onto the bottom rail 94. The stop blocks 93 are moved by the belt 91 in a manner that causes the stop blocks to come into contact with memory modules 5 that are deposited on the bottom rail 94. The memory modules 5 are moved by the stop blocks 93 toward the exit trays 95.

Referring to FIG. 10, there is illustrated the lateral view of a belt transport mechanism. An infrared sensor 100 is positioned just below the level of the belt 101 and where the stop blocks 102 on the belt 101 pass over the infrared sensor 100.

Figure 12:
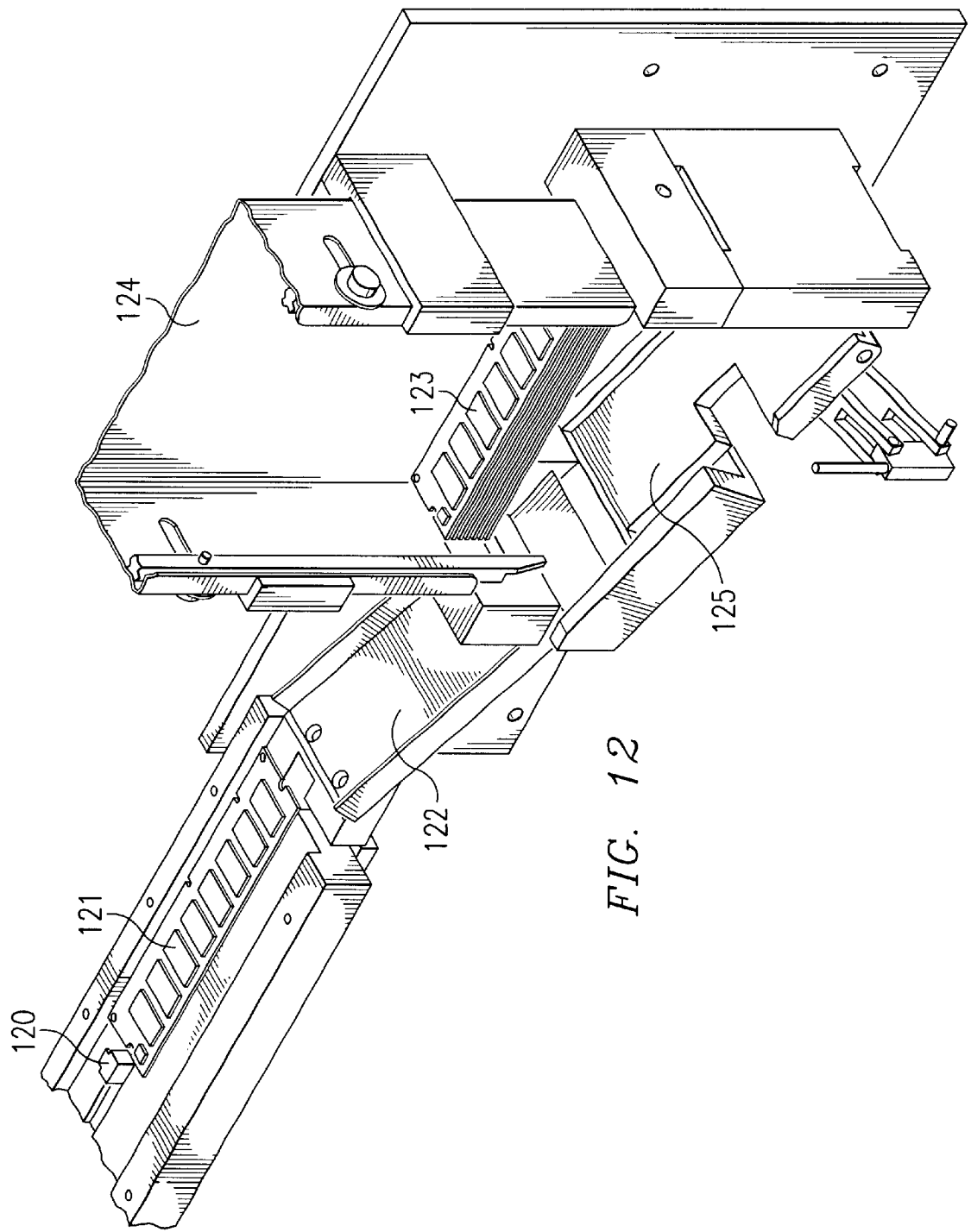
FIG. 12 illustrates the stacker assembly with belt mechanism.

Referring to FIG. 11, there is illustrated the top view of a belt transport mechanism. Stop blocks 110 attached to the belt 111 are constructed in a shape that, when viewed from the top, protrudes wider than the belt width. The shape of the stop block 110 allows the protruding part of the stop block 110 to cross in front of the infrared sensor 112. Referring to FIG. 12, there is illustrated a stacker assembly with belt transport mechanism. A stop block 120 is illustrated moving a memory module 121 toward an exit tray 122. Memory modules 123 are illustrated stacked in an output tray 124. Memory modules 121 slide onto a stacking platform 125. The stacking platform 125 raises the memory module 121 to the bottom of the stack of memory modules 123.

Figure 13:
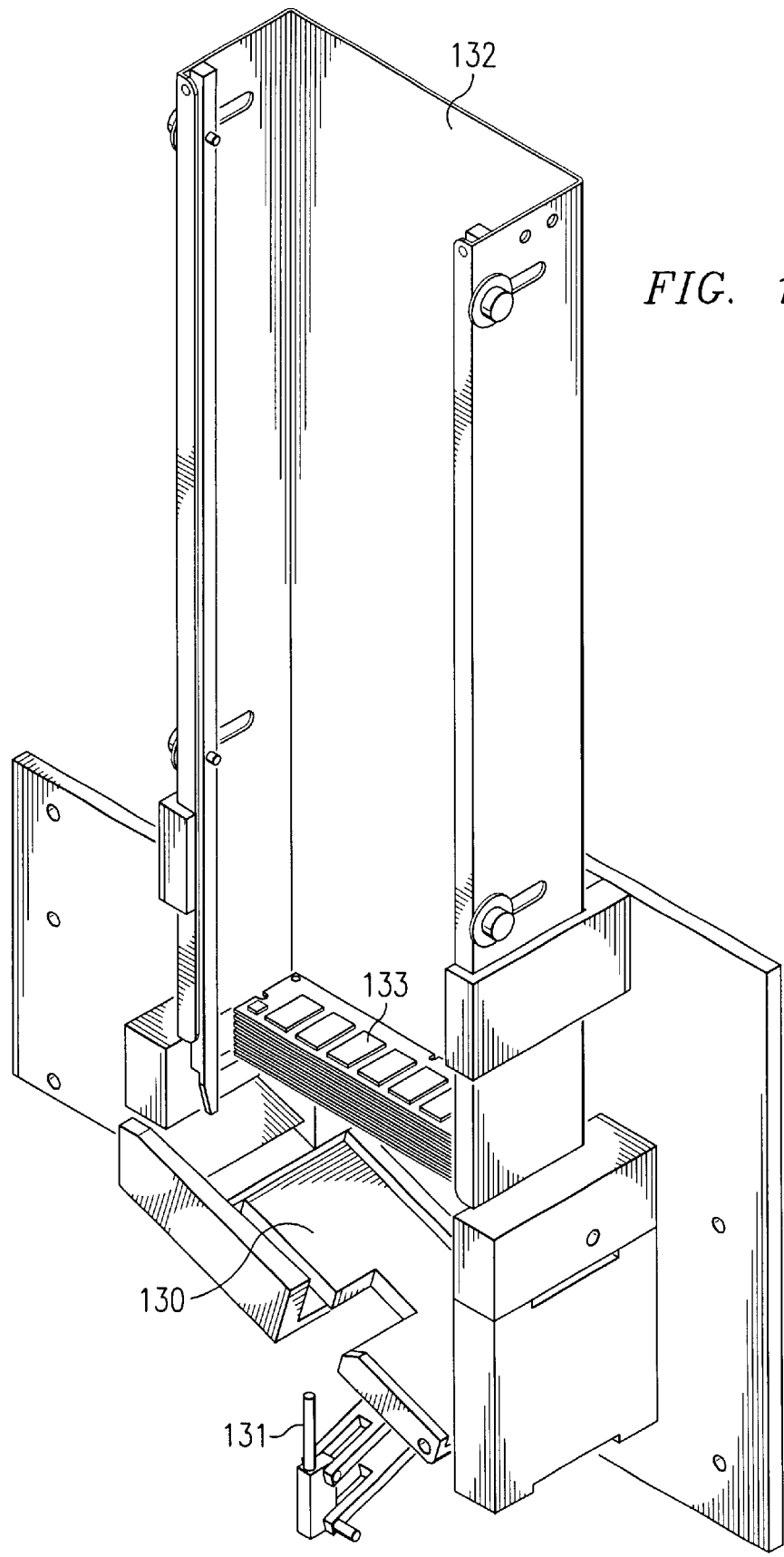
FIG. 13 illustrates the stacker assembly.

Referring to FIG. 13, there is illustrated a stacker assembly. The stacker assembly consists of a stacking platform 130, an alignment rod 131, and an output tray 132. Memory modules 121 are moved by the belt transport mechanism (FIGS. 10 and 11) onto the stacking platform 130. The stacking platform 130 adds the memory module 121 to the output stack 133 held in the output tray 132.

Figure 14:
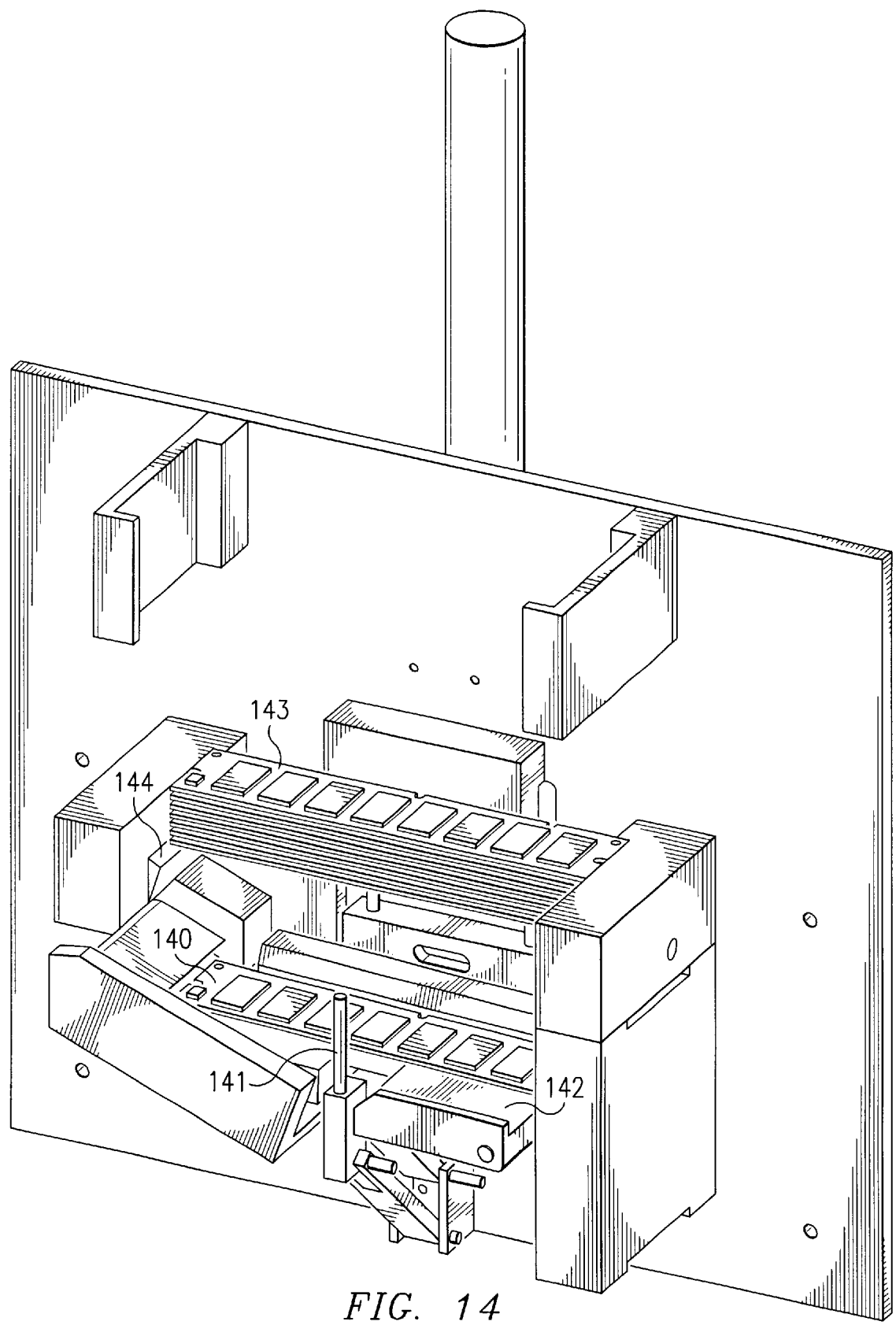
FIG. 14 illustrates the stacker with DIMM in position.

Referring to FIG. 14, there is illustrated a stacking mechanism. The electronic memory module 140 is held in alignment by a positioning rod 141. The stacking platform 142 moves the electronic memory module 140 toward the output stack 143. When the stacking platform 142 reaches its highest position, the stacker clips 144 slide under the electronic memory module 140 and remove it from the stacking platform 142. The stacker clips 144 support the bottom of the output stack 143.

Figure 15:
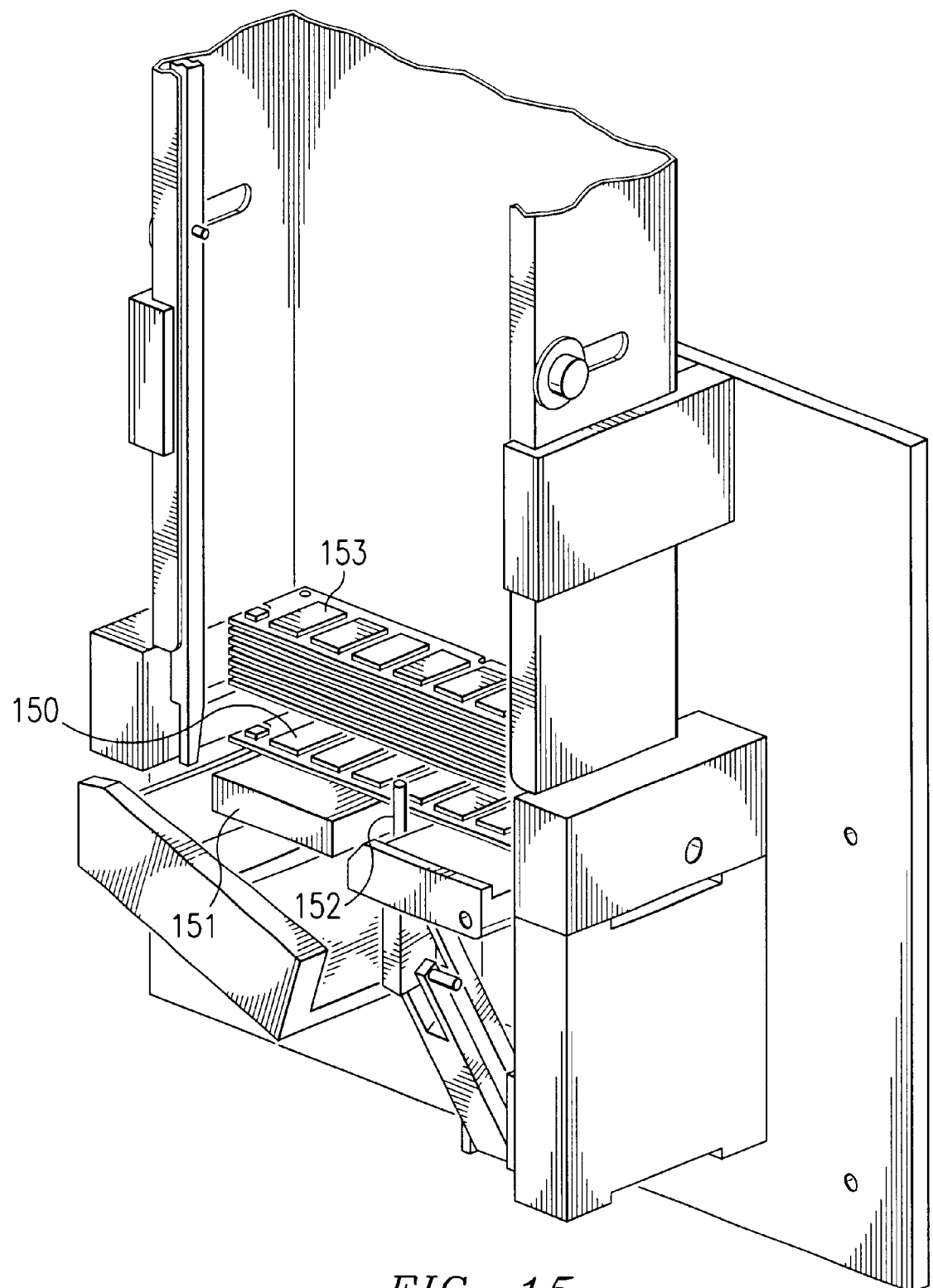
FIG. 15 illustrates the stacker assembly—up position.

Referring to FIG. 15, there is illustrated the stacker assembly in a raised position. There is illustrated a memory module 150 on the stacking platform 151. The alignment rod 152 is depicted in a position that illustrates how it moves a memory module to the proper position for addition to the output stack of memory modules 153. The alignment rod 152 moves the memory module to a position that is evenly aligned with the output stack of memory modules 153.

Figure 16:
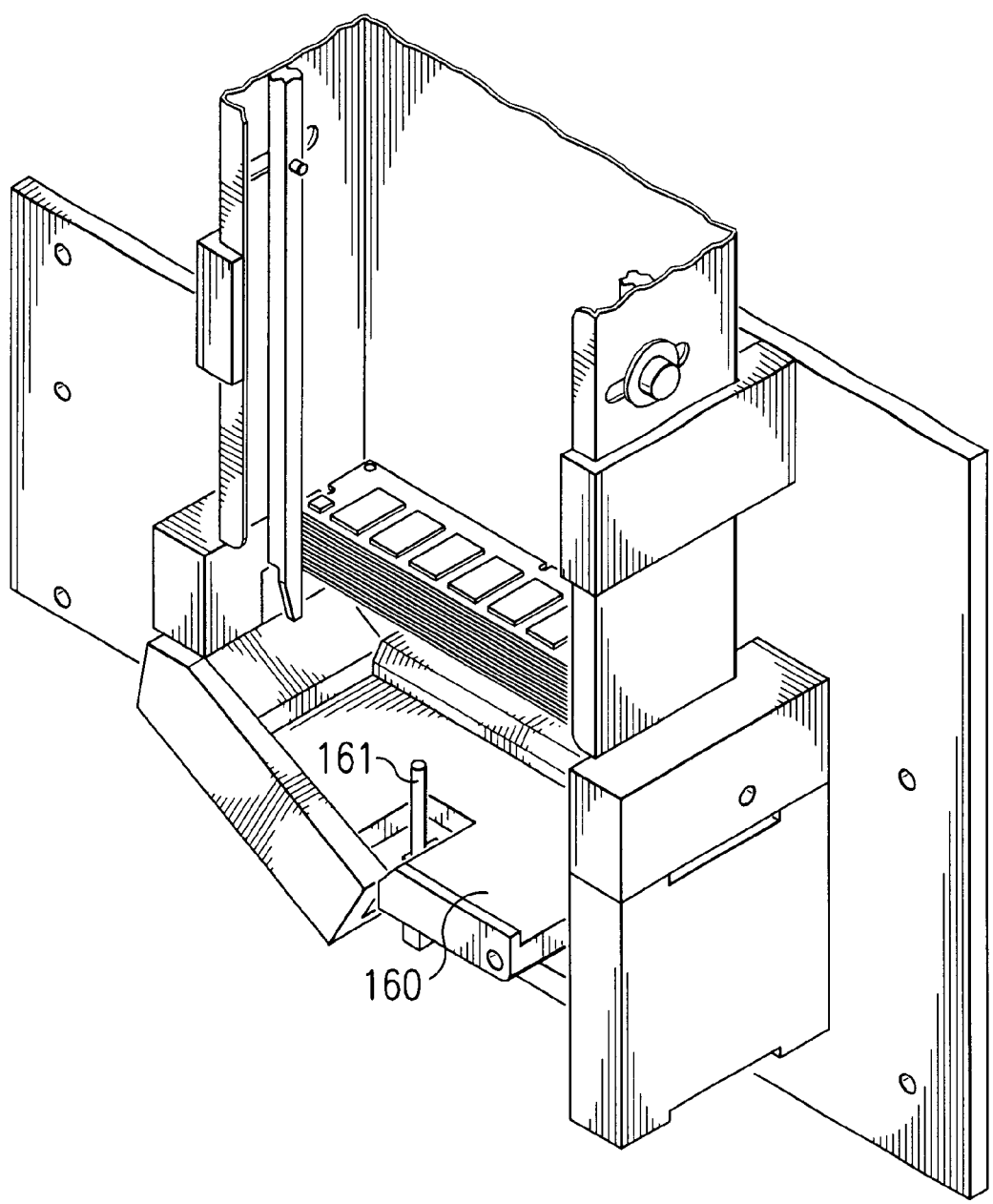
FIG. 16 illustrates the stacker assembly—down position.

Referring to FIG. 16, there is illustrated the stacker assembly in a lowered position. FIG. 16 depicts the stacking platform 160 and alignment rod 161 returning to a position to receive another memory module.

Although the preferred embodiment has been described in detail, it should be understood that various changes, substitutions and alterations can be made therein without departing from the spirit and scope of the invention as defined by the appended claims.

What is claimed is:

1. An apparatus for stacking electronic memory modules, said modules having a standard notch formed into an edge at first and second ends thereof, comprising: guide rods positioned to fit into said standard notches on said edges of said electronic memory modules whereby said electronic memory modules are held in precise alignment and in a uniform stack by said guide rods during movement of said electronic memory modules along said guide rods into a position to be tested.

2. The apparatus according to claim 1, wherein said 'structures' guide rods are incorporated into an assembly that stacks electronic memory modules.

3. The apparatus of claim 2 wherein said assembly is formed of metal.

4. The apparatus according to claim 1, wherein said guide rods are incorporated into an assembly that holds electronic memory modules in a position to be tested.

5. The apparatus according to claim 4, wherein said guide rods are incorporated into an assembly that holds electronic memory modules in a position to be tested and has mobility to insert said electronic memory modules into a testing fixture.

6. The apparatus of claim 1 wherein said guide rods are formed of metal.

7. An apparatus for stacking electronic memory modules in a stack in stacker assembly comprising:
   a. a stacker assembly having a bottom end and for holding a plurality of electronic memory modules;
   b. a movable flat surface aligned underneath said stacker assembly;
   c. a positioning apparatus for positioning said electronic memory modules on said flat surface;
   d. a transport device for moving said flat surface toward said stacker assembly;
   e. a removal device for removing a said electronic memory module from said flat surface and stores said electronic memory module in said stacker assembly.

8. The apparatus in accordance with claim 7, wherein said positioning apparatus further comprises an alignment rod aligned adjacent to said movable flat surface that has mobility such that said alignment rod can be moved away from said movable flat surface to permit electronic memory modules to be dispensed onto said movable flat surface, and can be moved toward said movable flat surface to place said electronic memory module in a fixed position in said stacker assembly.

9. The apparatus in claim 8, wherein said alignment rod is oriented substantially perpendicular to said flat surface.

10. The apparatus in accordance with claim 7, wherein said removal device further comprises:

a. a plurality of movable, wedge-shaped clips oriented such that a narrow end of said wedge-shaped clip is proximate to said movable flat surface and positioned at said bottom end of said stacker assembly;
   b. a mechanism for moving said movable flat surface to a position whereby said electronic memory modules positioned on said movable flat surface are moved from said narrow end of said movable wedge-shaped clips until said electronic memory modules are past a wide end of said plurality of wedge shaped clips wherein said wedge-shaped clips hold said electronic memory module on a bottom end of a stack of memory modules.

11. An apparatus for stacking electronic circuit modules, substantially uniform in size and shape, said circuit modules having first and second notches formed in respective first and second opposite ends of each said circuit module, comprising:

a tray assembly having a bottom side joined substantially at right angles to first and second opposite sides forming an inside space for receiving said circuit modules, said tray assembly disposed in a substantially vertical orientation;

first and second guide rods disposed within said tray assembly, parallel to said bottom side and respectively along an inside surface of each said first and second opposite side of said tray assembly, each said first and second guide rod positioned to engage said first and second notches; whereby a plurality of said circuit modules are held and evenly stacked in said tray assembly.

12. The apparatus of claim 11, wherein said tray assembly is removably incorporated into said apparatus for stacking said electronic circuit modules.

13. the apparatus of claim 11, wherein said tray assembly is removably incorporated into a mechanism for engaging and disengaging said electronic circuit module respectively to and from a testing position.

14. The apparatus of claim 13, wherein further said tray assembly is configured with a movable pusher assembly for inserting an individual said electronic circuit module into and retrieving said electronic circuit module from said testing position in a testing fixture.

15. The apparatus of claim 11, wherein said first and second guide rods are formed of metal.

16. The apparatus of claim 11, wherein said tray assembly is formed of metal.

17. The apparatus of claim 11, wherein said tray assembly is configured with a movable pusher assembly for inserting an individual electronic circuit module into a testing fixture having first and second guide rod segments for respectively engaging said first and second notches of said individual circuit module and enabling said movable pusher assembly to both engage and disengage said circuit module respectively into and away from a testing position in said testing fixture.

18. The apparatus of claim 11, further comprising a circuit module pusher frame disposed below and proximate said tray assembly for supporting an individual circuit module dispensed from said tray assembly, said pusher frame having first and second guide rod segments, colinear respectively with said first and second guide rods of said tray assembly when said pusher frame is in a retracted position, for engaging said first and second notches to drive said circuit module into a test fixture connector upon energizing of said pusher frame.

* * * * *